United States Patent
Mair et al.

(10) Patent No.: US 8,300,451 B2
(45) Date of Patent: Oct. 30, 2012

(54) TWO WORD LINE SRAM CELL WITH STRONG-SIDE WORD LINE BOOST FOR WRITE PROVIDED BY WEAK-SIDE WORD LINE

(75) Inventors: Hugh T. Mair, Fairview, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 12/750,270

(22) Filed: Mar. 30, 2010

(65) Prior Publication Data

US 2011/0242879 A1    Oct. 6, 2011

(51) Int. Cl.
G11C 11/00 (2006.01)
G11C 7/00 (2006.01)
(52) U.S. Cl. .................. 365/154; 365/189.011
(58) Field of Classification Search .......... 365/154, 365/189.011
See application file for complete search history.

(56) References Cited

U.S. PATENT DOCUMENTS

| | | | |
|---|---|---|---|
| 6,307,793 B1 * | 10/2001 | Murakami | 365/189.11 |
| 6,791,886 B1 * | 9/2004 | Bhavnagarwala et al. | 365/189.09 |
| 2009/0109732 A1 * | 4/2009 | Houston | 365/154 |
| 2011/0149661 A1 * | 6/2011 | Rajwani et al. | 365/189.11 |

OTHER PUBLICATIONS

Related case TI 65414, U.S. Appl. No. 12/499,666, filed Jul. 8, 2009 to Theodore W. Houston, et al. entitled "Local Sensing and Feedback for an SRAM Array".

* cited by examiner

*Primary Examiner* — Hoai V Ho
*Assistant Examiner* — Tri Hoang
(74) *Attorney, Agent, or Firm* — Rose Alyssa Keagy; Wade J. Brady, III; Frederick J. Telecky, Jr.

(57) ABSTRACT

An integrated circuit having a static random access memory (SRAM) includes an array of SRAM cells arranged in rows and columns having a write word line and a read/write word line connected to provide row access to the array of SRAM cells. The SRAM also includes a coupling capacitance connected between the write word line and a detachable allocation of the read/write word line as well as an overdrive module connected to charge the coupling capacitance and provide an overdrive voltage on the detachable allocation of the read/write word line during activation of the write word line. A method of operating an integrated circuit having an SRAM includes providing an overdrive voltage on the detachable allocation of the read/write word line corresponding to a charge redistribution across the coupling capacitance during part of a write cycle.

20 Claims, 4 Drawing Sheets

TWO WORD LINE SRAM CELL WITH STRONG-SIDE WORD LINE BOOST FOR WRITE PROVIDED BY WEAK-SIDE WORD LINE

TECHNICAL FIELD

The present disclosure is directed, in general, to an integrated circuit and, more specifically, to an integrated circuit having a static random access memory (SRAM) and a method of operating an integrated circuit having an SRAM.

BACKGROUND

An SRAM is typically designed to store many thousands of bits of information. These bits are stored in individual memory cells that are organized into rows and columns to make efficient use of space on a semiconductor substrate in an integrated circuit. A basic storage element is the six transistor SRAM cell, which may be written into and read from under SRAM control. In SRAM arrays having interleaved words in a same row, some of the six transistor storage cells are subject to being upset when reading from fully-addressed cells. An asymmetric SRAM cell may be employed where the cell is constructed to be more stable during a read operation. However, making the cell more stable during the read operation makes it more difficult to perform a write operation into the cell. Improvements in this area would prove beneficial in the art.

SUMMARY

Embodiments of the present disclosure provide an integrated circuit that includes a static random access memory (SRAM) and a method of operating an integrated circuit having an SRAM. In one embodiment, the SRAM includes an array of SRAM cells arranged in rows and columns and a write word line and a read/write word line connected to provide row access to the array of SRAM cells. The SRAM also includes a coupling capacitance connected between the write word line and a detachable allocation of the read/write word line as well as an overdrive module connected to charge the coupling capacitance and provide an overdrive voltage on the detachable allocation of the read/write word line during activation of the write word line.

In another aspect, the present disclosure provides the method of operating an integrated circuit having an SRAM that includes providing an array of SRAM cells arranged in rows and columns and allocating a write word line and a read/write word line to provide row access to the array of SRAM cells. The method also includes charging a coupling capacitance located between the write word line and a detachable allocation of the read/write word line during an initial part of a write cycle and supplying an overdrive voltage on the detachable allocation of the read/write word line corresponding to a charge redistribution across the coupling capacitance during a remaining part of the write cycle.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

For SRAM applications, there is a continuing requirement for reducing overall area and concurrently increasing read current for the SRAM. With scaling, there is also an increased requirement to improve the stability of an SRAM cell during a read operation while maintaining the ability to write into the cell. For a read/write-back operation with a two word line SRAM cell (one word line for the read operation and both word lines for a write operation), cell stability requirements benefit from a boosted word line arrangement to provide a more robust write operation in a write cycle. A goal in accomplishing this benefit is to provide the word line boost economically in both area and power with minimal impact on the speed of the write operation. Embodiments of the present disclosure incorporate these benefits.

Figure 1:
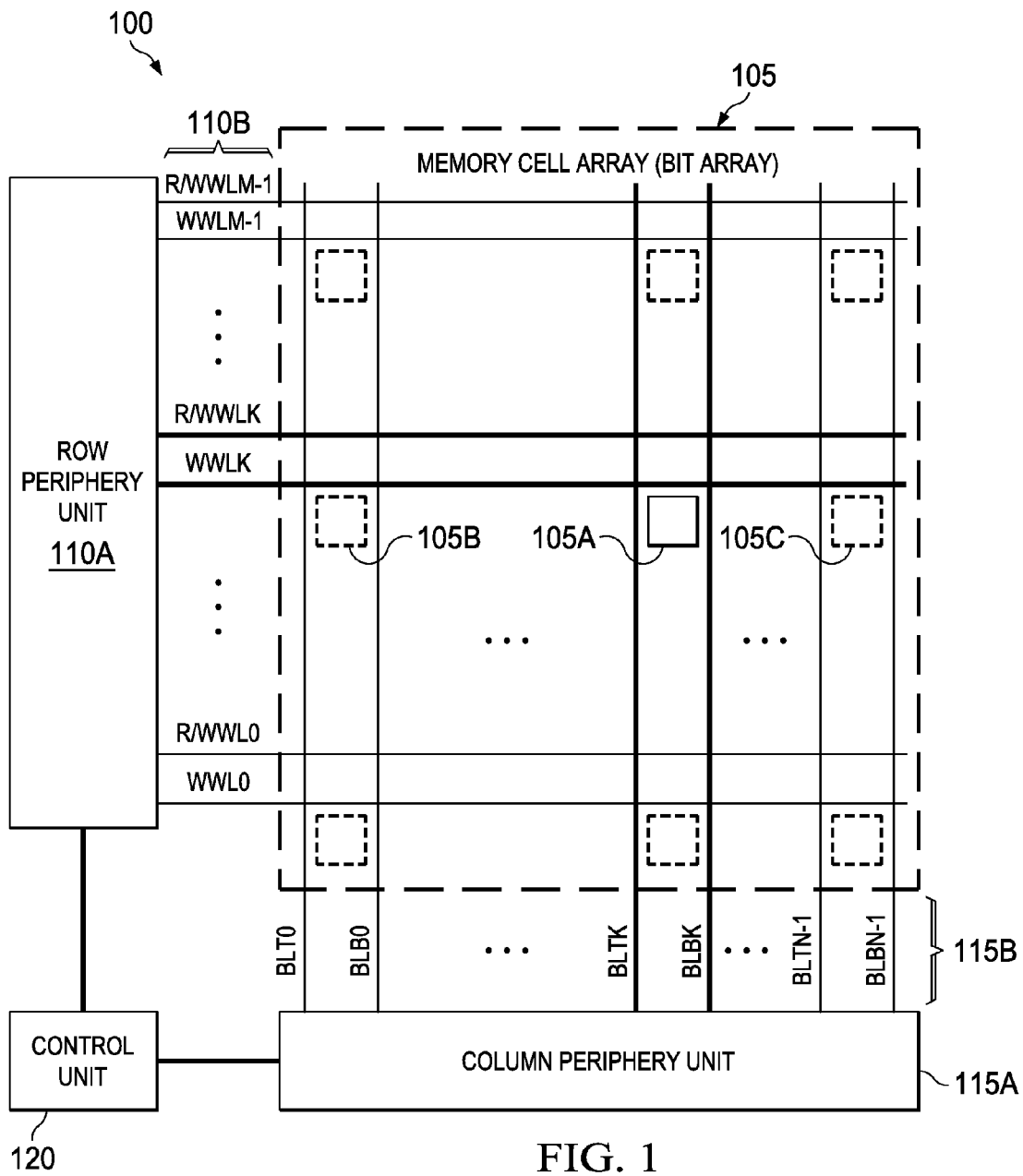
FIG. 1 illustrates a block diagram of an integrated circuit that includes a functional static random access memory (SRAM) constructed according to the principles of the present disclosure.

FIG. 1 illustrates a block diagram of an integrated circuit that includes a functional static random access memory (SRAM), generally designated 100, constructed according to the principles of the present disclosure. In general, embodiments of the functional SRAM 100 may be included in the integrated circuit as an embedded memory connected to other portions of the integrated circuit. Alternatively, the functional SRAM 100 may be a discrete memory contained in the integrated circuit.

The functional SRAM 100 includes an array of asymmetrical SRAM cells 105, a row periphery unit 110A, a column periphery unit 115A and a control unit 120. The array of asymmetrical SRAM cells 105 is organized in corresponding rows and columns, as shown. The array of asymmetrical SRAM cells 105 is connected to the row periphery unit 110A by M pairs 110B of write word lines and read/write word lines (i.e., WWL0, R/WWL0 through WWLM-1, R/WWLM-1). Each of the write and read/write word lines is controlled by a word line driver and each of the M pairs 110B provides access to a row of memory cells corresponding to at least a portion of the array of asymmetrical SRAM cells 105, as shown.

The array of asymmetrical SRAM cells 105 is also connected to the column periphery unit 115A by N pairs 115B of bit lines (i.e., BLT0, BLB0 through BLTN-1, BLBN-1). Each of these N pairs 115B provides access to a column of SRAM cells in the array 105, as shown. The control unit 115 is connected to the row and column periphery units 110A, 111A and controls their respective operations.

An SRAM cell 105A is typical of the array of asymmetrical SRAM cells 105. In the illustrated example, a read/write word line R/WWLK, a write word line WWLK and a pair of bit lines BLTK, BLBK are addressed. This action places the SRAM cell 105A in an addressed condition for reading from or writing into the SRAM cell 105A cell (i.e., performing a read or write operation). SRAM cells 105B, 105C are examples of half-addressed cells in the addressed row.

Each SRAM cell includes a "strong" side that facilitates reading from the cell while maintaining cell stability during a read operation. Additionally, each SRAM cell includes a "weak" side that facilitates writing either a "ONE" or a "ZERO" into the cell during a write operation. A corresponding read/write word line controls access to the strong side during the read operation, thereby providing a single-sided read from an addressed SRAM cell. This read/write word line and a corresponding write word line respectively control access to the strong and weak sides during a write operation, thereby providing a double-sided write into the addressed SRAM cell.

Embodiments of the present disclosure employ a coupling capacitance between each of the M pairs 110B of write word lines and read/write word lines to provide an overdrive voltage on the read/write word line that facilitates writing into the strong side of an SRAM cell during a write operation. This write operation provides a boosted double-sided write capability. That is, a voltage boost for writing into the strong side employs an overdrive voltage on the coupling capacitance to provide the boosted double-sided write capability.

Figure 2:
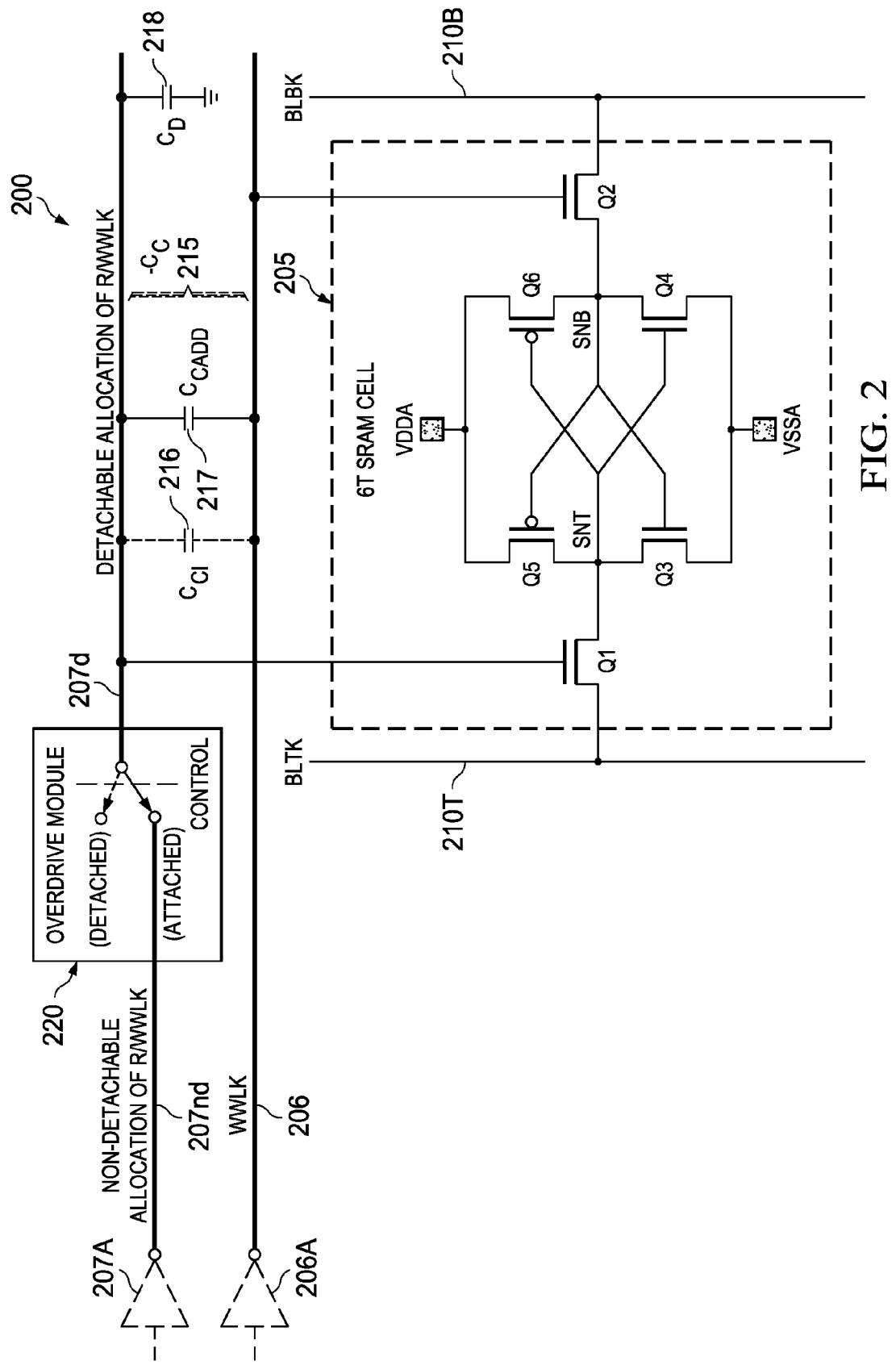
FIG. 2 illustrates a schematic diagram of an embodiment of a portion of an array of asymmetrical SRAM cells as may be employed in the functional SRAM of FIG. 1.

FIG. 2 illustrates a schematic diagram of an embodiment of a portion of an array of asymmetrical SRAM cells, generally designated 200, as may be employed in the functional SRAM 100 of FIG. 1. The portion of the array of asymmetrical SRAM cells 200 employs a boosted double-sided write capability and includes an asymmetrical SRAM cell 205, which is a six transistor (6T) SRAM cell. The asymmetrical SRAM cell 205 is connected to a write word line 206 (generally designated WWLK). In the illustrated embodiment, the asymmetrical SRAM cell 205 is also connected to a read/write word line (generally designated R/WWLK) having a nondetachable allocation 207nd and a detachable allocation 207d. Additionally, the asymmetrical SRAM cell 205 is connected to a pair of bit lines 210T and 210B (generally designated BLTK and BLBK).

The asymmetrical SRAM cell 205, which is typical of the portion of the array of asymmetrical SRAM cells 200, includes left/right NMOS pass gate transistors Q1/Q2, left/right NMOS driver transistors Q3/Q4, and left/right PMOS load transistors Q5/Q6. The asymmetrical SRAM cell 205 provides left/right storage nodes SNT/SNB (T stands for True and B stands for Bar or complement) for storing a bit state. The pair of bit lines 210T, 210B provides respective access to the left/right storage nodes SNT/SNB. The write and read/write word lines WWLK, R/WWLK provide control of bit line access (i.e., enabling or disabling access) to the asymmetrical SRAM cell 205 through the left/right NMOS pass gate transistors Q1/Q2.

The left storage node SNT is associated with the strong side of the asymmetrical SRAM cell 205, and the right storage node SNB is correspondingly associated with its weak side. Asymmetry of the cell may include a difference in threshold voltages or in transistor gate widths wherein a lower threshold voltage or wider gate width on the strong side for the pass gate or driver transistors Q1, Q3 may be provided. There can also be asymmetry in the transistor ratios (e.g., pass gate transistor Q1 to driver transistor Q3, pass gate transistor Q1 to load transistor Q5 or driver transistor Q3 to load transistor Q5), since the requirements for noise margin may dictate such a difference. An overdrive voltage is provided and connected to facilitate writing into the strong side of each cell of the array of asymmetrical SRAM cells.

The asymmetry may be provided such that the asymmetrical SRAM cell 205 is stable during a read operation wherein the left pass gate Q1 is conducting, and then use a Read/Write-back operation to allow half-addressed cells to be unstable during a write operation when both left/right pass gates Q1, Q2 are conducting. With this allowed instability in the write operation, the asymmetrical SRAM cell 205 may be designed to have a robust write operation when pulling the weak side low for the condition where the weak side pass gate transistor Q2 is more conductive (i.e., stronger) relative to the weak side load transistor Q6. To increase the robustness of the write operation when pulling the strong side low, the read/write word line R/WWLK (strong side word line) is boosted in a write cycle or in a Read/Write-back cycle, for example.

The portion of the array of asymmetrical SRAM cells 200 employs a write word line driver 206A, which provides a write activation signal to the write word line WWLK during a write operation and a read/write word line driver 207A, which provides a read/write activation signal to the read/write word line R/WWLK during both read and write operations of the asymmetrical SRAM cell 205. As noted before, the read/write word line R/WWLK provides both nondetachable and detachable allocations 207nd, 207d. The detachable allocation 207d provides the special purpose of allowing generation of the overdrive voltage based on activation of the write word line WWLK. In the illustrated embodiment, the detachable allocation 207d corresponds to part of the read/write word line R/WWLK. In another embodiment, the detachable allocation 207d may correspond to all of the read/write word line R/WWLK, as will be discussed below.

The write word line WWLK and the detachable allocation 207d of the read/write word line R/WWLK are coupled together through a coupling capacitance ($C_C$) 215 and connected to provide row access to each asymmetrical SRAM cell of the portion of the array of asymmetrical SRAM cells 200. In the illustrated embodiment, the coupling capacitance 215 is provided by an intrinsic coupling capacitance ($C_{CI}$) 216 and an added coupling capacitance ($C_{CADD}$) 217, as shown. In another embodiment of the present disclosure, the coupling capacitance 215 is solely the intrinsic coupling capacitance 216. The detachable allocation 207d is also connected to a stray read/write word line capacitance ($C_D$) 218, which is based on its physical layout and routing.

In the illustrated embodiment, an overdrive module 220 is depicted symbolically and is connected between the nondetachable and detachable allocations 207nd, 207d of the read/write word line R/WWLK. In one example of this arrangement, detachment of the detachable allocation 207d may employ a pass gate wherein the nondetachable allocation 207nd and the detachable allocation 207d employ a same logic value, as illustrated.

Alternatively, if detachment of the detachable allocation 207d is accomplished employing a tri-state driver (output of logic "one", logic "zero" or high impedance), the nondetachable allocation 207nd may refer to an input of the tri-state driver wherein the detachable allocation 207d then refers to the total read/write word line R/WWLK. This input may be the logic inverse of a signal on the detachable allocation 207d when it is attached (i.e., when it is being driven). Although the read/write word line driver 207A and the overdrive module 220 are shown as separate entities in FIG. 2, a combined function may be accomplished with the tri-state driver.

The overdrive module 220 is connected to charge the coupling capacitance 215 and provide an overdrive voltage $V_{OD}$ on the detachable allocation 207d of the read/write word line R/WWLK during activation of the write word line WWLK for the portion of the array of asymmetrical SRAM cells 200.

The overdrive module 220 is initially in an attached position that connects both the nondetachable and detachable allocations 207nd, 207d of the read/write word line R/WWLK to the read/write word line driver 207A. In the attached position, the read/write word line driver 207A provides a read/write activation voltage $V_{R/WA}$ to the entire read/write word line R/WWLK while the write word line driver 206A maintains the write word line WWLK at a deactivation voltage of about zero volts. In this condition, the read/write word line R/WWLK and the write word line WWLK are connected to provide a charging path for initially charging the coupling capacitance 215 prior to activation of the write word line WWLK in a write cycle. This action also places an initial stray capacitance charge on the stray read/write word line capacitance 218. Both of these charges correspond to the read/write activation voltage $V_{R/WA}$ provided by the read/write word line driver 207A.

After initially charging the coupling capacitance 215 and the stray read/write word line capacitance 218, the overdrive module 220 moves to a detached position for the read/write word line R/WWLK wherein the detachable allocation 207d remains connected to the initially charged coupling and stray capacitances 215, 218. The overdrive voltage $V_{OD}$ is provided on the detachable allocation 207d of the read/write word line R/WWLK during activation of the write word line WWLK by the write word line driver 206A. This occurs in a write cycle to boost writing into the strong side of the asymmetrical SRAM cell 205.

The overdrive voltage $V_{OD}$ is less than an initially charged coupling capacitance voltage (i.e., the read/write activation voltage $V_{R/WA}$) due to a charge redistribution between the coupling capacitance 215 and the stray read/write word line capacitance 218 when the write word line 206 is activated. Assume that the coupling capacitance 215 and the stray read/write word line capacitance 218 each have an initial charge sufficient to provide the read word line activation voltage $V_{R/WA}$ across them.

After detachment of the detachable allocation 207d of the read/write word line R/WWLK and activation of the write word line WWLK (to a write word line activation voltage $V_{WA}$), the write word line connection to the coupling capacitance 215 rises to the write word line activation voltage $V_{WA}$. This action to the write word line end of the coupling capacitance 215 forces the charge redistribution between the coupling capacitance 215 and the stray read word line capacitance 218 that provides the overdrive voltage $V_{OD}$ on the detachable allocation 207d of the read/write word line R/WWLK. The overdrive voltage $V_{OD}$ results from a voltage divider effect for the write word line activation voltage $V_{WA}$ between the coupling capacitance 215 and the stray read word line capacitance 218. The overdrive voltage $V_{OD}$ may be expressed as shown in equation (1).

$$V_{OD} = \frac{C_C}{C_C + C_D}(V_{WA}), \quad (1)$$

where the overdrive voltage $V_{OD}$ is seen to be proportional to the quantity $$\frac{C_C}{C_C + C_D},$$

which represents a ratio of the coupling capacitance $C_C$ to a total capacitance $(C_C+C_D)$ of the detachable allocation 207d of the read/write word line R/WWLK. The overdrive voltage $V_{OD}$ is also proportional to the write word line activation voltage $V_{WA}$.

As an example, consider a coupling capacitance $C_C$ equal to about three picofarads (3 pF) (e.g., $C_{CI}$ equals about 1.5 pF and $C_{CADD}$ equals about 1.5 pF), and the stray read/write word line capacitance $C_D$ equal to about seven picofarads (7 pF). Then, the overdrive voltage $V_{OD}$ is about 30 percent of the write word line activation voltage $V_{WA}$. If the coupling capacitance corresponds solely to the intrinsic coupling capacitance $C_{CI}$, the overdrive voltage $V_{OD}$ is about 18 percent of the write word line activation voltage $V_{WA}$. Therefore, the overdrive voltage $V_{OD}$ may be tailored to a specific application through the added coupling capacitance $C_{CADD}$.

After writing, the overdrive module 220 returns to the attached position wherein the detachable allocation 207d of the read/write word line R/WWLK is reattached. Generally, this reattachment may be prior to, concurrent with or subsequent to deactivation of the write word line. This action provides a discharge path for the coupling capacitance $C_C$ with deactivation of the write word line WWLK in a write cycle.

Figure 3:
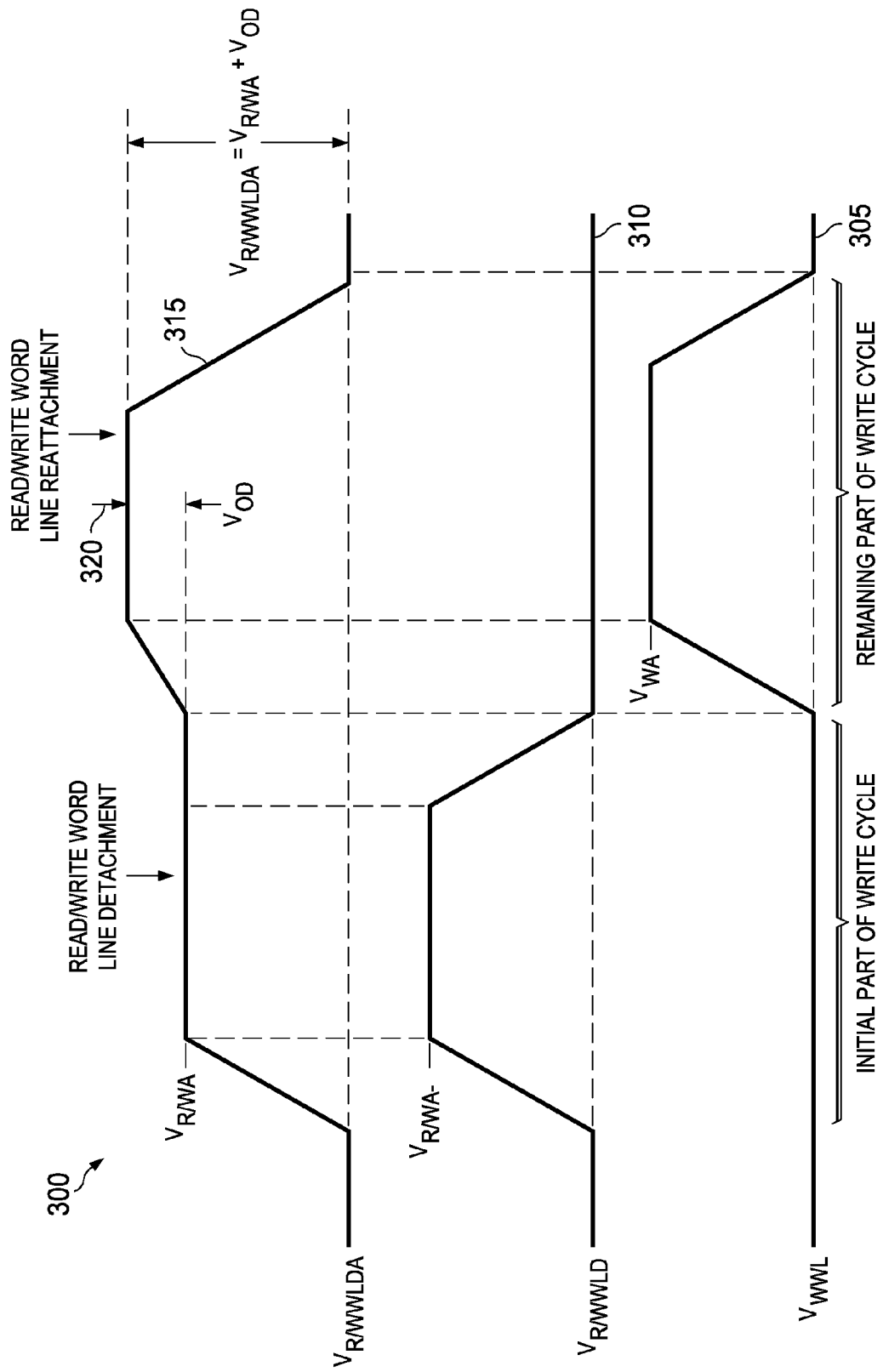
FIG. 3 illustrates word line waveforms depicting a write operation that provides an overdrive voltage on a detachable allocation of a read/write word line as may be employed in the functional SRAM 100 of FIG. 1 or the portion of the array of asymmetrical SRAM cells of FIG. 2.

FIG. 3 illustrates word line waveforms depicting a write operation that provides an overdrive voltage on a detachable allocation of a read/write word line, generally designated 300, as may be employed in the functional SRAM 100 of FIG. 1 or the portion of the array of asymmetrical SRAM cells 200 of FIG. 2. The word line waveforms 300 include waveforms for a write word line voltage ($V_{WWL}$) 305, a read/write word line driver voltage ($V_{R/WWLD}$) 310 and a corresponding detachable allocation read/write word line voltage ($V_{R/WWLDA}$) 315. The word line waveforms 300 are shown for initial and remaining parts of a write cycle.

With continued reference to the discussion of FIG. 2, the detachable allocation read/write word line voltage 315 corresponds to the read/write word line driver voltage 310 during the initial part of the write cycle thereby driving a still attached detachable allocation of the read/write word line to a read/write activation voltage $V_{R/WA}$. This action provides an initial charge on the coupling capacitance $C_C$ that is connected between corresponding write and read/write word lines and the stray read/write word line capacitance $C_D$. In the illustrated embodiment, the detachable allocation of the read/write word line is detached prior to deactivation of the read/write word line driver voltage 310 and activation of the write write word line voltage 305, as shown.

Activation of the write word line to a write word line activation voltage $V_{WA}$, provides an overdrive voltage ($V_{OD}$) 320 through initial charge redistribution. Then, a detachable allocation read/write word line voltage ($V_{R/WWLDA}$) 315 for writing into a strong side of an asymmetrical SRAM cell is equal to the read/write word line activation voltage $V_{R/WA}$ plus the overdrive voltage 320, as shown. Typically, the write and read/write word line activation voltages are about equal (e.g., equal to a driver supply voltage $V_{DD}$, for example). The detachable allocation of the read/write word line is reattached to the read/write word line driver near the conclusion of the remaining part of the write cycle thereby causing the detachable allocation of the read/write word line to return to a read/write deactivation voltage (e.g., about zero volts). The write word line voltage ($V_{WWL}$) 305 returns to a write deactivation value (also about zero volts) at about the same time thereby completing the write cycle.

The write cycle discussed with respect to FIGS. 2 and 3 may be employed with a read/write-back operation, as previously mentioned. The read/write-back operation may be employed to read half-addressed SRAM cells and write their current states back into them while new information is being written into fully-addressed SRAM cells. This allows half-addressed cells to be upset without losing their stored values.

The write cycle discussed with respect to FIGS. 2 and 3 may also be employed in a read/modify/write operation. In the read/modify/write operation, a class of operations (such as test-and-set, fetch-and-add or compare-and-swap, for example) are conducted that both read a portion of SRAM cells and write a new value into them concurrently. The new value may be completely new or some function of the previous value. These operations prevent race conditions in multithreaded applications.

Figure 4:
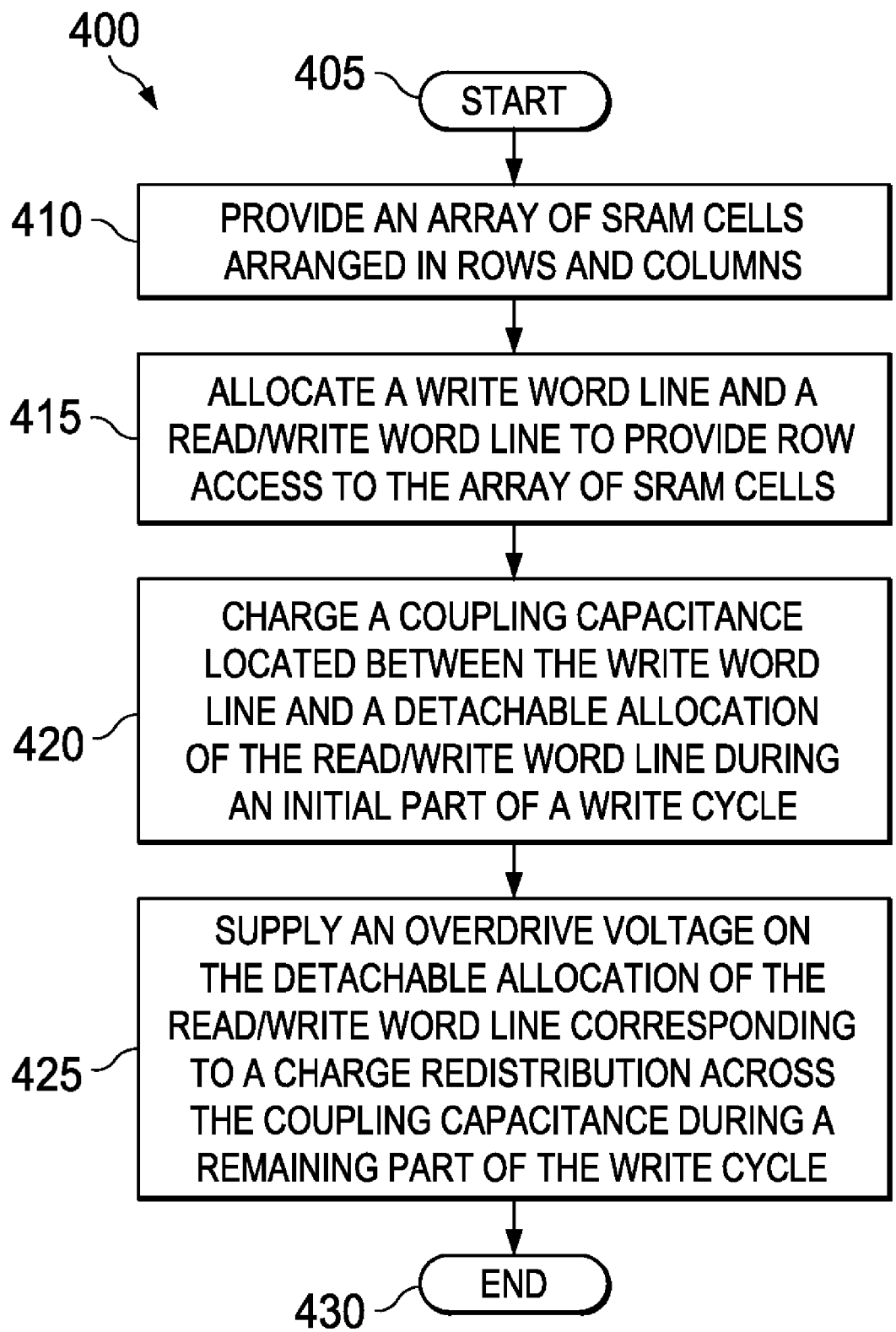
FIG. 4 illustrates a flow diagram of an embodiment of a method of operating an integrated circuit having an SRAM carried out according to the principles of the present disclosure.

FIG. 4 illustrates a flow diagram of an embodiment of a method of operating an integrated circuit having an SRAM, generally designated 400, carried out according to the principles of the present disclosure. The method 400 starts in a step 405 and provides an array of SRAM cells arranged in rows and columns, in a step 410. Then, in a step 415, a write word line and a read/write word line are allocated to provide row access to the array of SRAM cells. A coupling capacitance located between the write word line and a detachable allocation of the read/write word line is charged during an initial part of a write cycle, in a step 420. An overdrive voltage on the detachable allocation of the read/write word line is supplied corresponding to a charge redistribution across the coupling capacitance during a remaining part of the write cycle, in a step 425.

In one embodiment, the coupling capacitance is solely an intrinsic coupling capacitance. In another embodiment, the coupling capacitance is an intrinsic coupling capacitance and an added coupling capacitance. In yet another embodiment, the detachable allocation of the read/write word line detaches prior to activation of the write word line. Additionally, the detachable allocation of the read/write word line reattaches prior to, concurrent with or subsequent to deactivation of the write word line.

Generally, the overdrive voltage is proportional to a ratio of the coupling capacitance to a total capacitance of the detachable allocation of the read/write word line. Additionally, the overdrive voltage is proportional to a write word line activation voltage.

In one embodiment, the overdrive voltage facilitates writing into a strong side of at least one cell of the array of SRAM cells. In another embodiment, the overdrive voltage is about 15 to 30 percent of a write word line activation voltage. In yet another embodiment, the overdrive voltage is provided in a read/modify/write operation of the array of SRAM cells. The method 400 ends in a step 430.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. An integrated circuit having a static random access memory (SRAM), the SRAM comprising:
    an array of SRAM cells arranged in rows and columns;
    a write word line and a read/write word line connected to provide row access to the array of SRAM cells;
    a coupling capacitance connected between the write word line and a detachable allocation of the read/write word line; and
    an overdrive module connected to charge the coupling capacitance and provide an overdrive voltage on the detachable allocation of the read/write word line during activation of the write word line.

2. The integrated circuit as recited in claim 1 wherein the coupling capacitance is solely an intrinsic coupling capacitance.

3. The integrated circuit as recited in claim 1 wherein the coupling capacitance is provided by an intrinsic coupling capacitance and an added coupling capacitance.

4. The integrated circuit as recited in claim 1 wherein the overdrive voltage is provided in a read/modify/write operation of the array of SRAM cells.

5. The integrated circuit as recited in claim 1 wherein the overdrive voltage is proportional to a ratio of the coupling capacitance to a total capacitance of the detachable allocation of the read/write word line.

6. The integrated circuit as recited in claim 1 wherein the overdrive voltage is proportional to a write word line activation voltage.

7. The integrated circuit as recited in claim 1 wherein the overdrive voltage corresponds to a range of about 15 to 30 percent of a write word line activation voltage.

8. The integrated circuit as recited in claim 1 wherein the overdrive voltage is connected to facilitate writing into a strong side of at least one cell of the array of SRAM cells.

9. The integrated circuit as recited in claim 1 wherein the detachable allocation of the read/write word line is detached prior to activation of the write word line.

10. The integrated circuit as recited in claim 1 wherein the detachable allocation of the read/write word line is reattached prior to, concurrent with or subsequent to deactivation of the write word line.

11. A method of operating an integrated circuit having a static random access memory (SRAM), comprising:
    providing an array of SRAM cells arranged in rows and columns;
    allocating a write word line and a read/write word line to provide row access to the array of SRAM cells;
    charging a coupling capacitance located between the write word line and a detachable allocation of the read/write word line during an initial part of a write cycle; and
    supplying an overdrive voltage on the detachable allocation of the read/write word line corresponding to a charge redistribution across the coupling capacitance during a remaining part of the write cycle.

12. The method as recited in claim 11 wherein the coupling capacitance is solely an intrinsic coupling capacitance.

13. The method as recited in claim 11 wherein the coupling capacitance is an intrinsic coupling capacitance and an added coupling capacitance.

14. The method as recited in claim 11 wherein the overdrive voltage is provided in a read/modify/write operation of the array of SRAM cells.

15. The method as recited in claim 11 wherein the overdrive voltage is proportional to a ratio of the coupling capacitance to a total capacitance of the detachable allocation of the read/write word line.

16. The method as recited in claim 11 wherein the overdrive voltage is proportional to a write word line activation voltage.

17. The method as recited in claim 11 wherein the overdrive voltage is about 15 to 30 percent of a write word line activation voltage.

18. The method as recited in claim 11 wherein the overdrive voltage facilitates writing into a strong side of at least one cell of the array of SRAM cells.

19. The method as recited in claim 11 wherein the detachable allocation of the read/write word line detaches prior to activation of the write word line.

20. The method as recited in claim 11 wherein the detachable allocation of the read/write word line reattaches prior to, concurrent with or subsequent to deactivation of the write word line.

* * * * *